United States Patent [19]
Burns

[11] 4,295,912
[45] Oct. 20, 1981

[54] APPARATUS AND PROCESS FOR LAMINATING COMPOSITE TAPE

[75] Inventor: Carmen D. Burns, San Jose, Calif.

[73] Assignee: National Semiconductor Corporation, Santa Clara, Calif.

[21] Appl. No.: 58,404

[22] Filed: Jul. 17, 1979

Related U.S. Application Data

[63] Continuation-in-part of Ser. No. 921,644, Jul. 3, 1978, abandoned.

[51] Int. Cl.³ .................. B32B 31/08; B32B 31/20; B65H 17/40
[52] U.S. Cl. .................................. 156/324; 29/464; 29/819; 100/295; 156/330; 156/361; 156/543; 156/553; 156/583.1; 226/2; 226/8; 226/76; 226/157; 428/416; 428/473.5
[58] Field of Search ............... 100/295, 297; 156/191, 156/252, 290, 309, 312, 324, 330, 361, 495, 543, 553, 583, 308.4, 583.11; 226/2, 8, 76, 157; 270/52; 282/168, 210; 428/416, 473.5; 29/464, 819

[56] References Cited

U.S. PATENT DOCUMENTS

| | | | |
|---|---|---|---|
| 3,411,419 | 11/1968 | Becker et al. | 156/290 |
| 3,458,382 | 7/1969 | Buck | 156/543 |
| 3,556,899 | 1/1971 | Strobel | 156/553 |
| 3,619,310 | 11/1971 | Clarke | 156/156 |
| 3,717,543 | 2/1973 | Sinclair et al. | 156/330 |
| 3,776,804 | 12/1973 | Monahan et al. | 156/515 |
| 4,209,355 | 6/1980 | Burns | 156/630 |

Primary Examiner—Robert A. Dawson
Attorney, Agent, or Firm—Gail W. Woodward; James A. Sheridan

[57] ABSTRACT

A composite tape made of highly different components is laminated in a process that maintains registry between the components. Strips of metal and insulating material are aligned in registry and first tack bonded at intervals. Then the strips are area bonded to create the composite.

17 Claims, 4 Drawing Figures

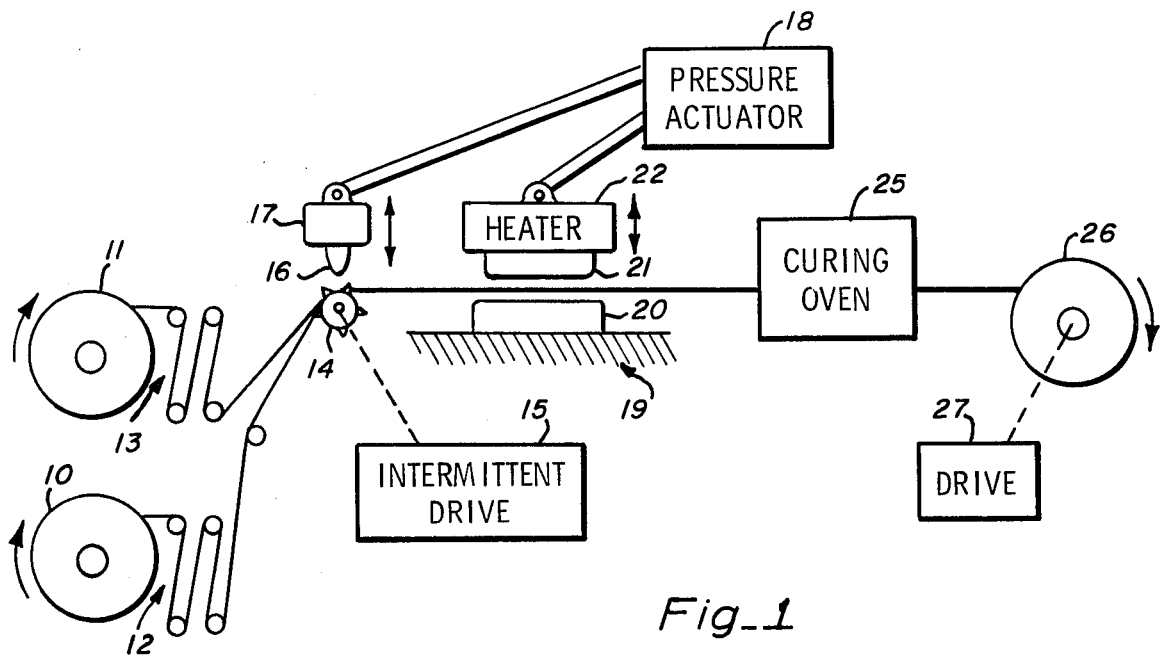
Fig_1
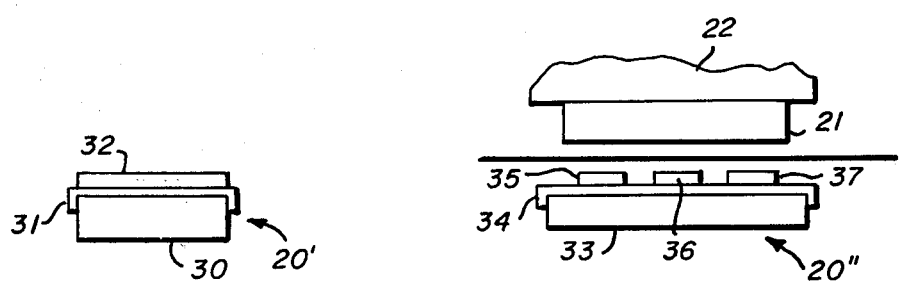
Fig_2        Fig_3

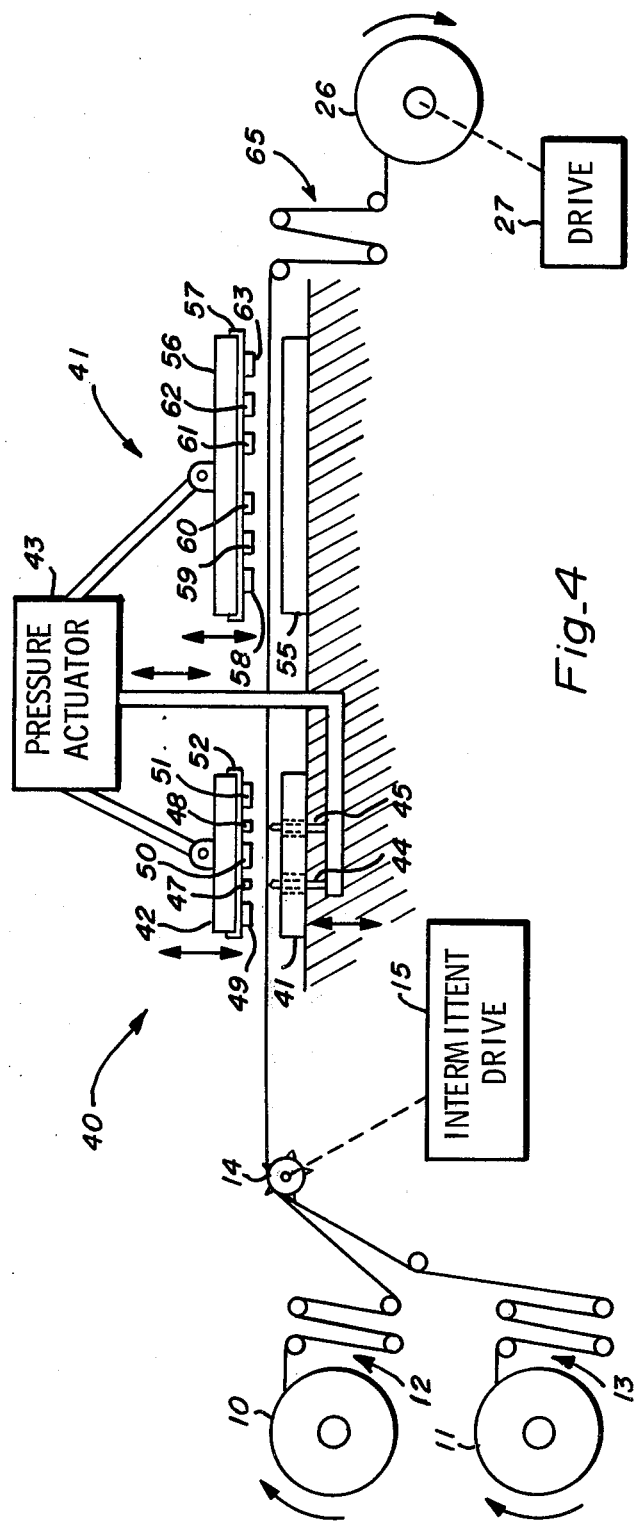
Fig_4

APPARATUS AND PROCESS FOR LAMINATING COMPOSITE TAPE

This application is a continuation-in-part of application Ser. No. 921,644, filed July 3, 1978, and now abandoned.

BACKGROUND OF THE INVENTION

The invention relates to the precision bonding of metal and insulating strips to create a composite tape intended for use in the high speed automatic assembly of integrated circuit (IC) chips into hermetic housing.

My copending application, now U.S. Pat. No. 4,209,355, is titled MANUFACTURE OF BUMPED COMPOSITE TAPE FOR AUTOMATIC GANG BONDING OF SEMICONDUCTOR DEVICES and discloses a composite tape process. At one stage of the disclosed process a copper strip is precisely bonded to an insulating strip. The bonding operation employs heat and pressure to activate an adhesive. In typical prior art laminating processes, roll bonding is common. In such an operation when two strips are to be precisely indexed it has been found that dissimilar materials tend to elongate at different rates thereby creating a growing registry error. For long strips this can be a serious handling factor. In some prior art approaches, tack bonding is followed by roll bonding. In this instance, the more flexible strip tends to bunch up between adjacent tacks and creates wrinkles that cannot be tolerated.

SUMMARY OF THE INVENTION

It is an object of the invention to laminate dissimilar strip elements into a composite tape with precision registry.

It is a further object of the invention to create a continuous precision indexing of elements in a composite tape bonding process.

These and other objects are achieved in the following manner. A metal strip having a series of edge located sprocket holes is to be laminated to an adhesive coated strip of insulating material having similar width and mating sprocket holes. The two strips are brought together on a sprocket wheel which acts to register the strips to each other. Then a bonding tool operated at a first temperature creates a tack line across the width of the strips. The sprocket wheel advances the strips an incremental distance and another tack line is created. This action is continued and therefore precisely joins the strips at intervals. Then an area bonding tool operated at a second, typically higher, temperature is employed to press the strips together to form a continuous composite. In an alternative embodiment, the registration produced by the sprocket wheel is followed by a pin indexed precision alignment immediately prior to tack bonding. In the bonding operations, tacking and bonding are accomplished while the strips are at rest.

BRIEF DESCRIPTION OF THE DRAWING

FIG. 1 shows a machine in schematic form for practicing the invention;

FIG. 2 shows a bonding platen structure;

FIG. 3 shows an alternative bonding platen structure; and

FIG. 4 shows an alternative bonding machine.

DETAILED DESCRIPTION OF THE INVENTION

In FIG. 1 the apparatus used in the invention is shown largely in schematic form. An insulating strip is carried on supply reel 10 and a metal strip, for example copper, is carried on supply reel 11. Both strips have been prepared to have matching edge located sprocket holes that act to advance and index the strips. The insulating strip on reel 10 has also been supplied with an adhesive coating. In the preferred form the adhesive is a B-staged epoxy which is well-known in the adhesive art. Such a material can be applied to the tape in a non-tacky form so that the tape can be handled and stored. The epoxy can be activated by heat and pressure to create an adhesive bond after which the epoxy can be cured to take full advantage of its adhesive properties. After cure the epoxy provides a stable high-temperature bond.

While not shown, the adhesive coated face of the insulating strip can be covered with a strippable protective coating that is removed and discarded as the strip is removed from reel 10. The strip first traverses a tension control device 12 which is shown as a series of rollers. This is a conventional force loaded idler roller series designed to provide a relatively constant tension to the strip as it enters the laminating machine.

A similar device at 13 provides a tension control to the metal strip being supplied from reel 11. The metal strip is typically prepared by punching and/or etching. If desired, the face to be bonded can be further prepared by well-known surface treatments that are intended to promote the lamination process.

Both strips are passed as shown over sprocket wheel 14 which serves to register the two strips to each other and to advance them through the machine. Sprocket wheel 14 is in the form of a roller over which the strips pass with teeth on each end for engaging the sprocket holes in the strips. Thus the roller portion can act as a backing or platen.

Sprocket wheel 14 is operated by an intermittent drive mechanism 15 which acts to periodically advance the strips by a predetermined, fixed increment which will be further described hereinafter. Thus, the strips will be advanced and then remain at rest for a period of time and the cycle repeated so as to advance the strips through the laminating machine.

While the strips are at rest, and in registry due to the teeth on sprocket wheel 14, a tacking tool 16 is briefly pressed against the strips. Tool 16 is heated by heater 17 to a suitable temperature and pressure actuator 18 operates to press tool 16 at suitable pressure during the rest portion of the transport cycle. Tool 16 may have a chisel- or wedge-shaped face arrayed perpendicular to the length of the strips so that it produces a line of pressure across the width of the tape using the roller face of wheel 14 as a platen. The heat and pressure are selected to tack the two strips together while they are in registry. Desirably, the heat is only sufficient to provide tacking and is not high enough to soften the insulator to where it will not register properly. Alternatively, tool 16 may have one or more bumps or tack areas on its face. These bumps produce a tacking between the strips which will serve to unite the strips. The actual shape and nature of the tacking are not critical. The important element is lack of motion between the strips and the bonding tool during the tacking separation.

Thus, tool 16 will create a succession of tack joints between the two strips as they leave sprocket wheel 14. This ensures the proper relationship between the strips and avoids the accumulation of registry error that normally develops in a conventional hot nip rolling process.

After the tacking operation the registered strips are passed through a bonding station at 19. A flat-faced platen 20 is located at a point spaced from sprocket wheel 14 and made long enough so that it spans at least two tack lines during the rest portion of the transport cycle. Platen 20 is made substantially wider than the tapes. A heated flat-faced pressure tool 21 mates with platen 20 and is heated by heater 21 to a suitable temperature which is typically higher than the tacking temperature. Pressure actuator 18 causes the heated tool 21 to be pressed against the strip during the transport rest interval so as to create an area bond between the strips that spans the tack lines. This means that the tapes are now fully laminated to form a composite. Since no motion was present during tacking or bonding, the strips are precisely, fully, and intimately bonded together over their respective lengths.

The composite tape is then advanced through oven 25 to cure the epoxy. Oven 25 is heated to a suitable cure temperature. The length of oven 25 in combination with the speed of the composite tape, as determined by the advancement of sprocket wheel 14, will determine the cure time. In practice the tape is caused to traverse a sinuous track (not shown) inside oven 25 so that a substantial effective oven length is available. Then oven time and temperature are selected to achieve a cure for the particular epoxy being used.

Upon leaving oven 25 the composite tape is wound onto take-up reel 26 which is operated by drive 27 which includes a slip clutch (not shown) to maintain a suitable tape take-up tension.

In an alternative embodiment oven 25 can be omitted from the laminating machine and take-up reel 26 located adjacent to bonding station 19. After the take-up reel is filled with bonded composite tape it is placed in a separate cure oven operating at a suitable temperature for a suitable cure time.

One of the essential requirements of the above-described machine is that a uniform bonding pressure be applied perpendicular to the strip face over the area of tool 21. This can be accomplished by making the faces of platen 20 and tool 21 flat and parallel. This proves to be somewhat difficult to do when using fairly large area devices.

FIG. 2 shows a single large area platen 20' suitable for use with large area bonds without resorting to precision facing. Platen base 30 is a metal backing block that need not be precisely machined. The face of base 30 is covered with a resilient pad 31, preferably a sheet of silicon rubber about ⅛ inch thick. A metal plate 32 is located on top of the resilient pad 31 to distribute force and to serve as the actual platen face. Typically plate 32 is a sheet of 50 mil thick copper. In this structure pad 31 will deform under pressure and act to distribute the total force uniformly across the face of plate 32. Thus platen 20' will automatically adjust and conform to mate with tool 21 without any precision shaping.

FIG. 3 shows an alternative platen structure that is preferred to that of FIG. 2. Instead of a single metal plate, three separate ones are used. A metal backing plate 20'' is covered with a resilient pad 34 and metal plates 35, 36, and 37 are secured thereto as shown. These metal plates have rounded edges and have a flat face width slightly greater than the spacing between plates. The tape advance is made equal to one-half of the center-to-center spacing of the plates so that the bonding areas repeat and overlap to create a continuous complete lamination. This embodiment permits utilizing smaller bond areas and makes pressure equalization more uniform and the bonding more reliable.

FIG. 4 shows an alternative bonding machine embodiment which provides for improved registry of the metal and insulating strips in the bonding operation. Where elements are the same as those of FIG. 1, the same numerals are used. In this embodiment, the metal and insulating strip reels have been inverted so that the metal strip is on the bottom.

The strips are initially indexed to each other by passing them over sprocket wheel 14 which is intermittently operated to advance the tapes together through the laminating machine. However, in this embodiment there is no tacking tool directly associated with the sprocket wheel. At this stage of the laminating process, the strips are indexed, but no bonding occurs.

The strips are then advanced into an adjacent tacking station 40, which includes a precision indexing mechanism. The actual tacking will be done using heater 41 and platen 42, which is intermittently pressed downward by pressure actuator 43. Actuator 43 also operates a set of retractable indexing pins 44 and 45, which extend upward through holes in the face of heater 41. When retracted, pins 44 and 45 are flush with the face of heater 41 so as not to interfere with the transport of the strips. During the rest transport interval pins 44 and 45 are advanced upward as platen 42 is pushed downward. Pins 44 and 45 are shaped to have tapered ends that will enter the sprocket holes in the strips and straight sides that will force the precision indexing of the strips relative to each other. This indexing is substantially better than that afforded by sprocket wheel 40 and the indexing occurs prior to any possible softening of the insulating strip by heater 41. Additionally, the indexing pins 44 and 45 hold the strips in indexed relation during the tacking step.

As platen 42 is lowered (and pins 44 and 45 raised) resilient pads 47 and 48 urge the strips against indexing pins 44 and 45 so as to force the indexing action. If desired, pads 47 and 48 can be fitted with centrally located holes that accommodate the tapered ends of pins 44 and 45. As platen 42 is lowered, pressure pads 49, 50, and 51 act to force the strips into contact with heater 41. Heat and pressure are applied to cause the two strips to be tacked together.

One of the features of this approach is that a relatively large area tacking can be accomplished at a temperature that is substantially lower than that required for bonding. This means that the insulator strip can be handled at a temperature that is sufficiently below its softening temperature that it maintains structural integrity as needed for precision indexing. This is of great importance when using such materials as polymide, which may be relatively soft at the bonding temperature.

Platen 42 is shown having a resilient facing 52 that is designed to equalize pressure and three metal bars 49, 50, and 51 act as the platen face that comes into contact with the strips being tacked. The three bars 49, 50, and 51 are understood to extend across the full width of the strips. However, more or fewer bars could be employed and the bars could be constructed to have limited area high spots on their faces. The basic concept involves a limited area tacking of the two strips together in precise indexed relationship at a suitable temperature. The nature of the tacking is not important so long as tacking is achieved sufficiently to hold the strips in indexed relationship until the bonding is accomplished.

With only two index pins 44 and 45 are shown, it is preferred that a similar pair be operated on the other side of the strips. Thus, in effect four index pins would be used with two located along each edge of the strips. This provides excellent indexing accuracy. However, more or fewer indexing pins could be employed within the context of the invention.

It can be seen that as the strips are incrementally advanced through tacking station 40, they will be precisely joined together albeit in temporary bonding fashion. Next, the strips proceed through station 41 which provides a complete bond. Here, heater 55 cooperates with platen 56, which is operated by pressure actuator 43 to press the strips against the heater during the rest transport interval. Thus, platen 56 is actuated simultaneously with platen 42. Platen 56 is covered with a resilient pad 57 for equalizing pressure that is applied via bars 58–63. These bars are arranged to have a width slightly greater than the gaps therebetween and bars 58–60 span a distance slightly greater than the tape advance increments. Bars 61–63 are similar but spaced with respect to bars 58–61 so as to provide bonding in the spaces between bars 58–60. Thus, in two advance increments, the entire areas of the strips will be subjected to heat and bonding pressure.

After bonding, the strips pass through tension control device 65 and are wound onto reel 26. In this operation, after the strips are wound onto the reel, the reel is placed in a curing oven to set the adhesive. If desired, a cooling air blast (not shown) can be incorporated between heater 55 and tension equalizer 65 so that the strips are not flexed while hot.

EXAMPLE 1

The laminating machine of FIG. 1 was employed to join 70 mm wide strip of five mil polyimide polymer coated with a 0.5-mil layer of B-staged epoxy to a 3-mil thick copper strip. The strips were advanced about three inches in 2 seconds and remained at rest for 8 seconds during which tacking and bonding were accomplished. Tool 16 was heated to about 125° C. and was pressed with a force of about 25 pounds per square inch to achieve tacking. Tool 21 was heated to about 135° C. and was operated at a pressure of about 25 pounds per square inch. The laminated tape was cured at 150° C. for 100 minutes to provide a composite suitable for use in a high speed automatic IC tape assembly operation. It was found that suitable bonding pressure was in the range of 20 to 50 pounds per square inch. The final registration capability of the machine was ±10 mils.

EXAMPLE 2

The machine of FIG. 4 was employed to join strips similar to those of Example 1. The machine cycle involved a 3-inch increment requiring 1.5 seconds and a rest interval of five seconds. Platen 42 was operated to apply a pressure of about 200±50 pounds per square inch and heater 41 was operated at 90° C.±5° C. Platen 56 was operated to apply a pressure of about 200±50 pounds per square inch and heater 55 was operated at 150°±5° C. The final registration capability of the machine was ±4 mils.

The invention has been described and specific examples detailed. Clearly there are other alternatives and equivalents that are within the spirit and intent of the invention. For example, while a B-staged epoxy is taught as the preferred adhesive, other materials could prove suitable. A thermoplastic material or a pressure activated material could be substituted. For such adhesives the curing step would be omitted. Additionally, more than two strips could be simultaneously laminated. For example, an insulating strip could have both faces coated with B-staged epoxy and metal strips laminated to both faces. If desired, the epoxy could be coated on the metal strip. Regardless of the complexity or proliferation of strips the process and apparatus disclosed could be used for precision registry and lamination. Accordingly, it is intended that the scope of the invention be limited only by the following claims.

I claim:

1. The process for precision laminating at least a pair of strips having substantially dissimilar mechanical properties and at least one of which has a surface coating of unactivated but activatable adhesive, said strips further having mating edge located perforations, said process comprising:
   advancing said strips together in intermittent fashion, said intermittent advancing operating to advance said strips a predetermined distance in a cyclic manner having a predetermined rest interval;
   aligning said strips to obtain registry therebetween;
   pressing a first bonding tool against said strips during said rest interval, said first bonding tool being contoured to contact a limited area of said strips;
   heating said strips to at least partly activate said adhesive during said rest interval and while said strips are in registry to create a tack bond between said strips;
   pressing a second bonding tool against said strips to heat and activate said adhesive during said rest interval, said second bonding tool being contoured to contact said strips over an area having a length of at least said predetermined distance; and
   heating said strips to a second temperature to activate said adhesive over the area of said second bonding tool whereby said strips are fully laminated together.

2. The process of claim 1 wherein said aligning step includes passing said strips over a wheel having projections thereon to engage said perforations in said strips.

3. The process of claim 2 wherein said wheel also acts as a platen for said first bonding tool.

4. The process of claim 1 in which said second temperature is substantially higher than said first temperature.

5. The process of claim 4 wherein said adhesive is a B-staged epoxy and including the step of heating said laminated tape to cure said epoxy.

6. The process of claim 5 wherein said strips are composed respectively of copper and epoxy coated polyimide polymer, said first temperature is about 90° C. to 125° C., and said second temperature is about 135° C. to 150° C.

7. The process of claim 2 wherein said aligning comprises first passing said strips over said wheel having projections thereon to engage said perforations in said strips to approximately register said strips followed by transporting said strips to a tacking station in which said strips are precision registered just prior to said tack bond.

8. The processes of claim 7 wherein said tacking station includes a set of retractable indexing pins and including the step of pushing said indexing pins through said perforations and pressing said first bonding tool against said strips while said pins are located in said perforations.

9. Apparatus for precision laminating at least a pair of strips having substantially dissimilar mechanical properties and at least one of which has a surface coating of unactivated but activatable adhesive, said strips further having mating edge located perforations, said apparatus comprising:
   means for advancing said strips simultaneously through said apparatus on an intermittent cycle having a transport interval and a rest interval, said transport interval producing a predetermined advance;
   means for locating said strips to register said perforations;
   means for pressing a first bonding tool against said strips during said rest interval said first bonding tool having a surface that contacts said strips over a limited area portion;
   means for heating said strips to a first temperature to at least partly activate said adhesive and tack said strips together over a limited area;
   means for pressing a second bonding tool against said strips, said second bonding tool having an area including the width of said strips and a length at least equal to said predetermined advance; and
   means for heating said strips to a second temperature to activate said adhesive and to laminate said strips substantially over their entire area.

10. The apparatus of claim 9 wherein said second bonding tool is located in face-to-face relationship with a flat faced platen.

11. The apparatus of claim 9 wherein said means for locating, comprise a toothed wheel.

12. The apparatus of claim 11 wherein said means for locating further includes indexing pins; and
   means for inserting said indexing pins into said perforations while said strips are at rest to achieve precision indexing.

13. The apparatus of claim 12 wherein said indexing pins are associated with said first bonding tool.

14. The apparatus of claim 11 wherein said first bonding tool is heated and employs said wheel as a platen.

15. The apparatus of claim 10 wherein said platen comprises a support block, a resilient covering over said block and a deformable metal plate on top of said resilient covering, said metal plate being located opposite said bonding tool and acting as the platen surface therefor.

16. The apparatus of claim 15 wherein said metal plate is divided into a plurality of individual sections, said sections having rounded edges and flat face portions that are wider than the spacing therebetween.

17. The apparatus of claim 16 wherein said platen is divided into two portions each having a plurality of said sections, said portions being spaced apart so that said sections in the second portion register with the spaces between sections in said first portion on sequential transport intervals.

* * * * *